United States Patent [19]
Jun et al.

[11] Patent Number: 5,946,246
[45] Date of Patent: Aug. 31, 1999

[54] SEMICONDUCTOR MEMORY DEVICE WITH BUILT-IN SELF TEST CIRCUIT

[75] Inventors: Hong-Shin Jun; Chang-Hyun Cho, both of Suwon, Rep. of Korea

[73] Assignee: Samsung Electronics, Co., Ltd., Suwon, Rep. of Korea

[21] Appl. No.: 08/996,002

[22] Filed: Dec. 22, 1997

[30] Foreign Application Priority Data

Dec. 20, 1996 [KR] Rep. of Korea ...................... 96-69172

[51] Int. Cl.$^6$ .................................................. G11C 7/00
[52] U.S. Cl. .................. 365/201; 365/236; 365/230.03; 365/189.02; 365/230.02
[58] Field of Search ................................. 365/201, 5, 11, 365/230.03, 189.02, 236, 230.02; 371/22.5, 25.1, 21.2, 21.1

[56] References Cited

U.S. PATENT DOCUMENTS

| | | | |
|---|---|---|---|
| 5,258,986 | 11/1993 | Zerbe | 371/21.2 |
| 5,383,195 | 1/1995 | Spence et al. | 371/22.5 |
| 5,675,545 | 10/1997 | Madhavan et al. | 365/201 |

*Primary Examiner*—David Nelms
*Assistant Examiner*—Thong Le
*Attorney, Agent, or Firm*—Marger Johnson & McCollom, P.C.

[57] ABSTRACT

A semiconductor memory device with a built-in self test (BIST) circuit is disclosed including: a plurality of memory blocks; a plurality of selectors for selecting an address, a control signal and data of each memory block to a normal mode or a test mode in response to a BIST mode signal; a plurality of background generators for generating data to be written in each memory block and comparing data; a plurality of comparators for comparing data read from each memory block with the comparing data in response to the BIST mode signal and for generating a comparative result; a combination circuit for combining outputs of the plurality of comparator and for generating a test result; and a test controller for supplying a test address and a control signal to the plurality of selectors, for supplying a background number and an output inversion control signal to the plurality of background generators, and for supplying a comparing control signal to the plurality of comparators.

20 Claims, 2 Drawing Sheets

FIG. 2

| Algorithm | State (CYCLE) |
|---|---|
| for each data background in DBP<br>  for each address background in ABP<br>    for each STAGE from 0 to 3<br>      for each Address<br>        if (STAGE=0) Write ADB<br>        if (STAGE=1)<br>          Read ADB and Compare<br>          Write ADB'<br>        if (STAGE=2)<br>          Read ADB' and Compare<br>          Write ADB<br>        if (STAGE=3) Read ADB and Compare<br>      end for<br>    end for<br>  end for<br>end for | init<br><br><br><br>stage03<br><br>read<br>write<br><br>read<br>write<br>stage03<br>inc_stage<br>inc_adb<br>inc-dbg<br>final |

SEMICONDUCTOR MEMORY DEVICE WITH BUILT-IN SELF TEST CIRCUIT

BACKGROUND OF THE INVENTION

1. Field of the Invention

The present invention lies in the field of semiconductor memory devices and, more specifically, pertains to improved methods and apparatus for built-in self test of such devices.

2. Description of the Prior Art

As semiconductor memory manufacturing techniques advance and ever greater density is achieved, it is now common to see complete memory systems contained in a single integrated circuit chip. As DRAM densities increase, testing such circuits is increasingly challenging due to the large number of memory cells and multiple memory blocks within a single chip. Testing time is critically important, and testing techniques are limited by available chip area and pin limitations.

Generally, two methods for testing a packaged RAM are distinguished by the place where a test pattern is generated. One method uses external test equipment and the other is by a built-in self test (BIST) circuit, i.e. on-board the memory IC. The test method using external test equipment has an advantage in that it is easy to test the RAMs by using various patterns. The test equipment can be programmed as desired. However, in order for the test equipment to interface to an address data input, a data output and control signals of each block of RAM during a test mode of operations, all ports of the RAMs must be connected to a pin which is accessible by the test equipment, and accordingly overhead is incurred in routing and the use of the pins. Alternatively, the pins can be multiplexed with respect to the RAM blocks, but since the RAM blocks then cannot be simultaneously tested, the test time increases.

In the test method using the BIST circuit, if a BIST mode is set from the exterior, the BIST circuit is activated and the RAMs are tested by applying a predetermined test pattern. The test result indicates whether or not an error was produced. Since the number of external connections needed for such testing is minimized, the RAM blocks can be simultaneously tested and therefore test time is reduced. However, since a test circuit for generating the test pattern is added on-board the IC, chip area overhead is incurred and the test pattern is fixed. What is needed, therefore, is improved self-test methods and apparatus for providing rapid functional testing of multiple blocks of RAM while minimizing chip area and pin count.

SUMMARY OF THE INVENTION

It is an object of the present invention to provide a semiconductor memory device with a built-in self test (BIST) circuit to simultaneously test multiple blocks of RAM. One aspect of the invention is minimization of interconnection costs by sharing one BIST controller yet providing for testing a plurality of RAM blocks. Another feature of the invention accomodates concurrent testing of memory blocks of different sizes. This feature helps to reduce routing overhead as well as test time.

According to one aspect of the present invention, a semiconductor memory device with a built-in self test (BIST) circuit includes a plurality of memory blocks, which can be of different sizes (e.g. numbers of words). Each memory block has associated selectors for selecting an address, a control signal and input data source. The selectors operate in response to a normal mode or a test mode of operation as indicated by a BIST mode signal. Each memory block (or "RAM Block") includes an associated background generator to provide test data to be written in the corresponding memory block and to provide comparison data for comparison to data read from the RAM Block. The background generator variously provides test data in response to a background number (BGN), and can invert the test data responsive to an invert control signal INV_BG. The background generator provides test data having the appropriate number of bits (word size) for the corresponding RAM block. Each RAM Block further includes a comparator for comparing data read from the memory block with the comparing data in response to the BIST mode signal and for generating a comparative result. Combinatorial logic combines the outputs of the plurality of comparators and generates an overall error signal if any block fails.

A single test controller provides the testing for all of the blocks concurrently. The controller includes a test enable generator for supplying a test enable control signal to each of the plurality of selectors. The test controller further includes counters for supplying a data background number and an output inversion control signal to the plurality of background generators. The controller further includes a control signal generator that provides a done signal, a test write enable signal, a background invert control signal, and a compare control signal to the plurality of comparators in proper sequence so as to test the multiple RAM blocks simultaneously as further explained below.

BRIEF DESCRIPTION OF THE DRAWINGS

FIG. 2 is a diagram illustrating a single order addressing (SOA) algorithm executed in a cycle controller shown in FIG. 1.

DETAILED DESCRIPTION OF PREFERRED EMBODIMENT

Figure 1:
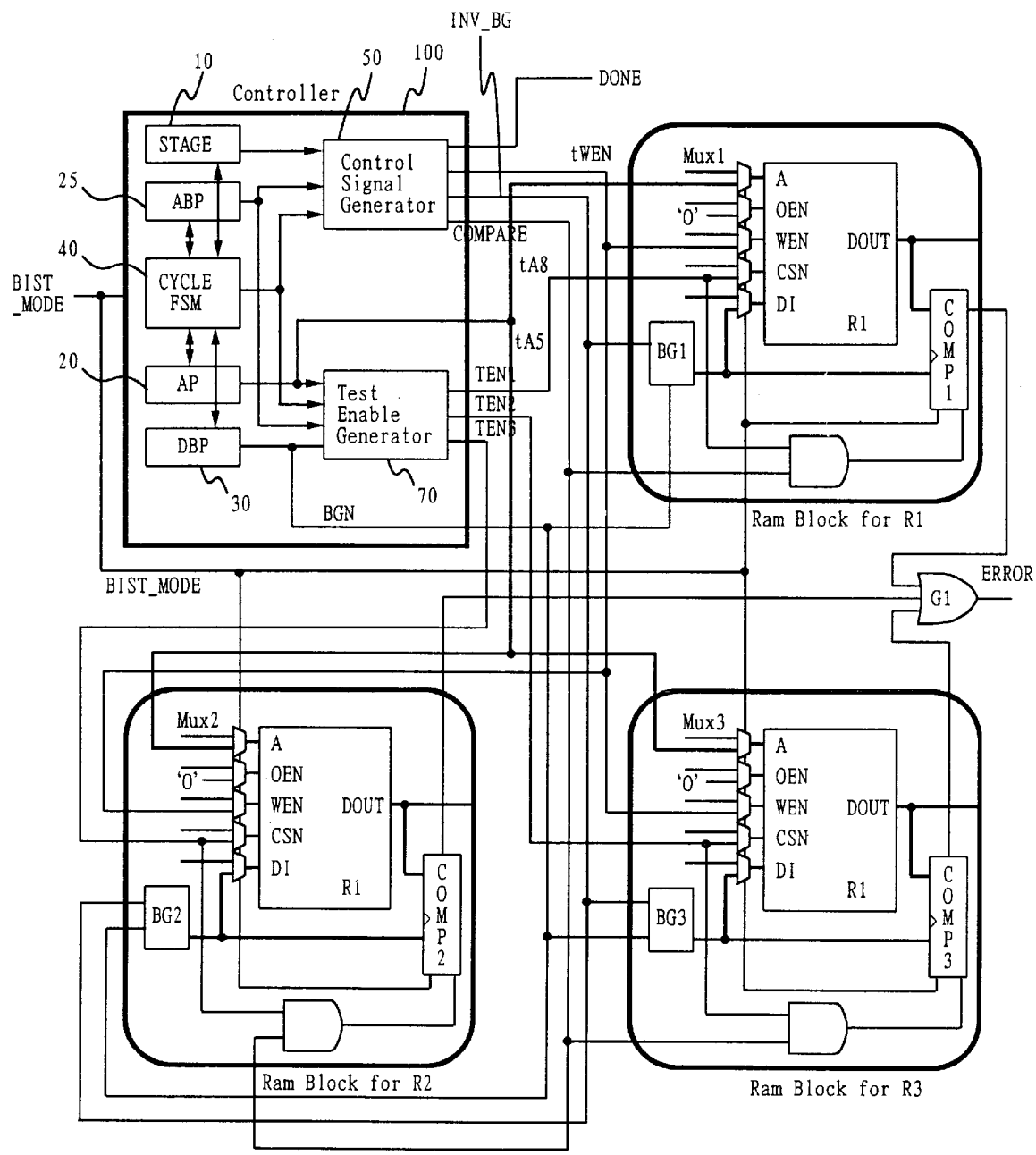
FIG. 1 is a block diagram of a semiconductor memory device with a built-in self test circuit according to the present invention.

Referring to FIG. 1, a semiconductor memory device with a BIST circuit 100 includes a plurality of memory blocks R1, R2 and R3. Each memory block, or RAM Block, includes a set of selectors labeled MUX1, MUX2 and MUX3 respectively. In each block, each selector selects one of two inputs, for selecting an address ("A"), control signals ("OEN, WEN" etc.) and data ("DI") in response to a normal mode or a test mode as indicated by the BIST mode signal BIST_MODE which is externally applied as illustrated. Each memory block further includes a corresponding background generator—BG1, BG2 and BG3—for providing data to be written in each memory block and to provide comparison data. Each background generator provides test data for the corresponding memory block in response to a common background number BGN. For example:

TABLE 1

An example of truth table of data generator

| BGN[1:01] | INV-BG | Output of BG |
|---|---|---|
| 00 | 0 | 00000000 |
| 01 | 0 | 00001111 |
| 01 | 1 | 11110000 |
| 10 | 0 | 00110011 |
| 10 | 1 | 11001100 |

TABLE 1-continued

An example of truth table of data generator

| BGN[1:01] | INV-BG | Output of BG |
|---|---|---|
| 11 | 0 | 01010101 |
| 11 | 1 | 10101010 |

Each memory block further includes a corresponding comparator—COMP1, COMP2 and COMP3—for comparing data read from the memory block with the comparing data provided by the corresponding background generator in response to the BIST mode signal BIST_MODE and for generating a comparative result E1, E2 and E3 respectively. An OR logic gate G1 for ORing test error signals E1–E3 provides an overall test result signal ERROR, which is asserted true if any of the individual memory block error signals indicates an error.

The memory includes a test controller 100 for supplying test addresses tA5 and tA8 and a control signal tWEN to the selectors MUX1, MUX2 and MUX3, for supplying a background number BGN and an output inversion control signal INV_BG to the background generators BG1, BG2 and BG3, and for supplying a comparing control signal COMPARE to the comparators COMP1, COMP2 and COMP3. The memory blocks R1, R2 and R3 may have different sizes from one another and share the single controller 100, thereby minimizing interconnection costs.

The controller 100 for achieving a SOA (single order addressing) algorithm includes a first up counter 10 "STAGE" for counting stages from 0 to 3, a second up counter 20 "AP" as an address pointer for counting a test address, a third up counter 25 "ABP" for counting an address background number (pointer), and a fourth up counter 30 for counting a data background number "DBP".

A cycle controller 40 generates a test operation cycle by performing the SOA algorithm while communicating with the first to fourth up counters 10 to 30. A control signal generator 50 generates a test end signal DONE, the test write control signal tWEN, the background control signal INV_GB and the comparing control signal COMPARE. These control signals are generated in response to stage information from the first up counter 10, address background information of the third up counter 25 and an output of the cycle controller 40. Details of control signal logic are further described below.

The test circuit 100 further includes a test enable generator 70 for generating test enable signals TEN1, TEN2 and TEN3 of the memory blocks by combining the address pointer information of the second up counter 20 and outputs of the cycle controller 40, the third up counter 25 and the fourth up counter 30.

If the number of the memory blocks is N, and if the number of bits of an address line of each memory block is Ri (where 1≦i≦N), we can define the following quantities:

| AddressSize (Ri) | R(i) |
|---|---|
| last value of an address of Ri, | LastAddress(Ri) |
| the number of address backgrounds of Ri, | ABGSize(Ri) |
| the number of data backgrounds of Ri | DBGSize(Ri) |
| the number of bits of data input/output of Ri | word size |

Then, the control signals of the control signal generator 50, that is, the test end signal DONE, the test write control signal tWEN, the background control signal INV_BG and the comparing control signal COMPARE are defined as follows:

$$INV\_BG = STAGE[0](XOR)tWEN \quad \text{when } ABP=0$$
$$= AP[ABP-1](XOR)tWEN(XQR)STAGE[0] \quad \text{else}$$

The test enable signal TEN(i) maintains an active state while the address pointer value AP is smaller than the last address value LastAddress(Ri) of the corresponding memory block; the address background value ABP is smaller than the corresponding address background size ABGSize (Ri); and the data background value DBP is smaller than the corresponding data background size DBGSize(Ri); otherwise it has an inactive state.

Thus in boolean logic form:

$$TEN(i) = 0 \text{ when } AP \leq \text{LastAddress (Ri)},$$
$$ABP \leq ABGSize \text{ (Ri) and } DBP \leq DBGSize \text{ (Ri); 1 else.}$$

The test address signal is connected only by the size of an address line of the RAM among address pointer signals, and an address has only an incremental variation. In other words, only the applicable address lines are connected to each RAM block, depending on its size. The address pointer AP provides adequate address lines for the largest RAM block. For the smaller RAM blocks, only selected address lines need be connected. For example, if the largest block, say R1 requires 8 address lines, then AP provides 8 bits of addressing on tA8. If another, smaller block R2 requires only 5 bits, then only five of the address lines, say AP[4:0] are connected to R2 input "A".

As indicated in FIG. 2, the cycle controller 40 includes an initialization cycle for initializing values of the first to fourth counters 10, 20, 25, 30; a read cycle for reading test data M(tA) from the memory block and for comparing the read data with data to be compared; a write cycle for writing the test data in the background generators, a cycle stage for performing only the read and write operation at stages 0 and 3, a stage increment cycle inc_stage, address and data background number increment cycles inc_adb and inc_dbg, and a final cycle.

Each background generator BGi generates the comparing data in response to the background control signal INV_BG and the background number BGN of the fourth counter 30.

Each comparator COMPi compares data generated from the corresponding memory block Ri with data generated from the corresponding background generator BGi and generates the test error signal of the corresponding memory block in response to the comparing control signal COMPARE.

To further illustrate operation of the addressing according to the invention, an address background number is provided by the ABP counter 25. The address background number is $\log_2 N+1$ where N is the required number of address lines.

| ADB0 | ADB0' | ADB1 | ADB1' | ADB2 | ADB2' | ADB3 | ADB3' | Address |
|------|-------|------|-------|------|-------|------|-------|---------|
| 0 | 1 | 0 | 1 | 0 | 1 | 0 | 1 | 0 |
| 0 | 1 | 0 | 1 | 0 | 1 | 1 | 0 | 1 |
| 0 | 1 | 0 | 1 | 1 | 0 | 0 | 1 | 2 |
| 0 | 1 | 0 | 1 | 1 | 0 | 1 | 0 | 3 |
| 0 | 1 | 1 | 0 | 0 | 1 | 0 | 1 | 4 |
| 0 | 1 | 1 | 0 | 0 | 1 | 1 | 0 | 5 |
| 0 | 1 | 1 | 0 | 1 | 0 | 0 | 1 | 6 |
| 0 | 1 | 1 | 0 | 1 | 0 | 1 | 0 | 7 |

For example, the above table illustrates operation for an 8×1 RAM block. As described above, since one controller is shared to test a plurality of RAMs having various sizes, interconnection costs can be minimized.

Having described and illustrated the principles of the invention in a preferred embodiment thereof, it should be apparent that the invention can be modified in arrangement and detail without departing from such principles. I claim all modifications and variations coming within the spirit and scope of the following claims.

What is claimed is:

1. A semiconductor memory device with a built-in self test circuit, comprising:

a plurality of memory blocks;

a plurality of selecting means for selecting an address, a control signal and data of each memory block to a normal mode or a test mode in response to a built-in self test mode signal;

a plurality of background generating means for generating data to be written in each memory block and comparing data;

a plurality of comparing means for comparing data read from each memory block with said comparing data in response to said built-in self test mode signal and for generating a comparative result;

a combination means for combining outputs of said plurality of comparing means and forming a single test result signal; and a test controlling circuit for supplying a test address and a control signal to said plurality of selecting means, for supplying a background number and an output inversion control signal to said plurality of background generating means, and for supplying a comparing control signal to said plurality of comparing means.

2. A semiconductor memory device with a built-in self test circuit as claimed in claim 1, wherein said plurality of memory blocks have different sizes from one another.

3. A semiconductor memory device with a built-in self test circuit as claimed in claim 1, wherein said test controlling circuit executes a single order addressing (SOA) algorithm.

4. A semiconductor memory device with a built-in self test circuit as claimed in claim 1, wherein said test controlling circuit comprises:

a first counter for counting a stage step;

a second counter of an address pointer for counting an address;

a third counter for counting an address background number;

a fourth counter for counting a data background number;

a cycle controller for generating a test operation cycle by performing a single order addressing (SOA) algorithm while communicating with said first to fourth counters;

a control signal generator for generating a test end signal, a test write control signal, a background control signal, a comparing control signal in response to stage information of said first counter, address background information of said third counter and an output of said cycle controller; and a test enable generator for generating a test enable signal of each memory block by combining outputs of said cycle controller, said second counter, said third counter and said fourth counter.

5. A semiconductor memory device with a built-in self test circuit as claimed in claim 4, wherein said cycle controller includes an initialization cycle, a read cycle, a write cycle, a stage increment cycle, an address background number increment cycle, a data background number increment cycle, and a final cycle.

6. A semiconductor memory device with a built-in self test circuit as claimed in claim 4, wherein each background generating means generates said comparing data in response to said background control signal and said background number of said fourth counter.

7. A semiconductor memory device with a built-in self test circuit as claimed in claim 4, wherein each comparing means compares data generated from the corresponding memory block with data generated from the corresponding background generating means and generates a test error signal of the corresponding memory block in response to said comparing control signal.

8. A semiconductor memory device with a built-in self test circuit as claimed in claim 4, wherein said combination means comprises an OR gate for ORing test error signals of said plurality of comparing means.

9. A semiconductor memory device with a built-in self test circuit, comprising:

a plurality of memory blocks;

a plurality of selecting means for selecting an address, a control signal and data of each memory block to a normal mode or a test mode in response to a built-in self test mode signal;

a plurality of background generating means for generating data to be written in each memory block and comparing data;

a plurality of comparing means for comparing data read from each memory block with said comparing data in response to said built-in self test mode signal and for generating a comparative result;

a combination means for combining outputs of said plurality of comparing means and forming a single test result signal; and a test controlling circuit for supplying a test address and a control signal to said plurality of selecting means, for supplying a background number and an output inversion control signal to said plurality of background generating means, and for supplying a comparing control signal to said plurality of comparing means, wherein said test controlling circuit comprises:

a first counter for counting a stage step;

a second counter of an address pointer for counting an address;

a third counter for counting an address background number;

a fourth counter for counting a data background number;

a cycle controller for generating a test operation cycle by performing a single order addressing (SOA) algorithm while communicating with said first to fourth counters;

a control signal generator for generating a test end signal, a test write control signal, a background control signal, a comparing control signal in response to stage information of said first counter, address background information of said third counter and an output of said cycle controller; and a test enable generator for generating a test enable signal of each memory block by combining outputs of said cycle controller, said second counter, said third counter and said fourth counter, wherein said test enable signal maintains an active state if an address pointer value is smaller than a last address value of each memory block, an address background value is smaller than an address background size and a data background value is smaller than a data background size, otherwise said test enable signal has an inactive state.

10. A semiconductor memory device with a built-in self test circuit, comprising:

a plurality of memory blocks;

each memory block including multiplexer circuits for selecting an address and for selecting a data input source for operation in a normal mode or a test mode in response to a built-in self test (BIST) mode signal;

each memory block further including a background generating circuit for generating test data responsive to a background number for testing the memory block;

and a test controlling circuit for supplying a test address to the address selection multiplexer circuits in each of the plurality of memory blocks and for supplying the background number to the background generating circuit in each of the plurality of memory block during the test mode of operation.

11. A semiconductor memory device according to claim 10 and each memory block further including a logic circuit for comparing read data to the test data in response to the built-in self test mode signal and a compare control signal, so as to form a corresponding individual block test result signal.

12. A semiconductor memory device according to claim 11 and further comprising a second logic circuit for combining the individual block test result signals of said plurality of comparing means to form a single device test result logic signal.

13. A semiconductor memory device according to claim 10 wherein the test address supplied by the test controlling circuit includes a predetermined number of bit lines adequate for addressing a largest one of the memory blocks.

14. A semiconductor memory device according to claim 10 wherein the test controlling circuit includes an address background counter for providing the test address and for initializing and incrementing the test address responsive to a test cycle controller.

15. A semiconductor memory device according to claim 10 wherein the test controlling circuit includes a data background counter for providing the data background number and for initializing and incrementing the data background number responsive to a test cycle controller.

16. A method of testing a semiconductor integrated circuit memory device having a plurality of memory blocks comprising the steps of:

switching all of the memory blocks simultaneously into a built-in self-test (BIST) mode of operation;

providing a single test address for addressing all of the memory blocks simultaneously;

generating test data for testing all of the memory blocks simultaneously; and testing all of the memory blocks simultaneously using the single test address and the generated test data.

17. A method according to claim 16 wherein said providing a single test address includes providing a test address having a number of bits adequate for addressing a largest one of the memory blocks, and connecting fewer than all of said bits of test address to such other ones of the memory blocks as require fewer bits of test address for addressing such other ones of the memory blocks.

18. A method according to claim 16 wherein said generating test data includes providing a background number to each of the memory blocks; and, in each memory block, locally generating test data responsive to the background number and having a number of bits or word size matched to that of the corresponding memory block.

19. A method according to claim 16 wherein said testing all of the memory blocks includes:

an initialization operation;

a read and compare test data operation;

a write test data operation;

an address increment operation;

a test data increment operation; and a final cycle.

20. A method according to claim 16 including inverting selected bits of the generated test data in all of the memory blocks responsive to a single inverting control signal.

* * * * *

UNITED STATES PATENT AND TRADEMARK OFFICE
CERTIFICATE OF CORRECTION

PATENT NO.     : 5,946,246
DATED          : August 31, 1999
INVENTOR(S)    : Hong-Shin Jun and Chang-Hyun Cho It is certified that error appears in the above-identified patent and that said Letters Patent is hereby corrected as shown below:

Column 2,
Line 63, "(the text is missing from the table)" should read -- 00 1 11111111 --

Column 4,
Line 7, "(XQR)" should read -- (XOR) --

Signed and Sealed this

Tenth Day of September, 2002

Attest:

JAMES E. ROGAN
Attesting Officer          Director of the United States Patent and Trademark Office